(12) United States Patent
Yang

(10) Patent No.: US 8,258,783 B2
(45) Date of Patent: Sep. 4, 2012

(54) FORCE HEARING VALUE AND POSITION DETECTION FOR MAGNETIC ELASTIC BODY OF MAGNETIC CONDUCTION

(76) Inventor: Tai-Her Yang, Dzan-Hwa (TW)

( * ) Notice: Subject to any disclaimer, the term of this patent is extended or adjusted under 35 U.S.C. 154(b) by 407 days.

(21) Appl. No.: 12/216,474

(22) Filed: Jul. 7, 2008

(65) Prior Publication Data
US 2010/0000335 A1 Jan. 7, 2010

(51) Int. Cl.
G01R 33/18 (2006.01)
G01B 7/14 (2006.01)
(52) U.S. Cl. .................... 324/209; 324/207.11
(58) Field of Classification Search .......... None
See application file for complete search history.

(56) References Cited

U.S. PATENT DOCUMENTS

| | | | | |
|---|---|---|---|---|
| 3,969,668 A * | 7/1976 | Weinzinger et al. | .......... | 324/209 |
| 4,975,643 A * | 12/1990 | Buchwald | ................ | 324/207.12 |
| 5,297,439 A * | 3/1994 | Tyren et al. | ..................... | 73/779 |
| 5,473,245 A * | 12/1995 | Silvus et al. | ............. | 324/207.13 |
| 5,982,054 A * | 11/1999 | Rathore et al. | .................. | 310/26 |
| 6,118,271 A * | 9/2000 | Ely et al. | .................. | 324/207.17 |
| 6,239,593 B1 * | 5/2001 | Burkhardt et al. | ............ | 324/233 |
| 6,865,959 B2 * | 3/2005 | Kilmartin et al. | ........ | 73/862.333 |
| 7,261,005 B2 * | 8/2007 | Bunyer et al. | ............ | 73/862.333 |

* cited by examiner

Primary Examiner — Vinh Nguyen
(74) Attorney, Agent, or Firm — Bacon & Thomas, PLLC

(57) ABSTRACT

In a method for detecting a force bearing value and position of a magnetostrictive body, the magnetostrictive body is stretched or shrunk by changes of passing magnetic fluxes or by the internal stress or external pushing or pulling force, such that the peripheral magnetic field surrounding the force bearing point is varied according to the stretching push or shrinking push, wherein its force bearing value or position is calculated by comparing the magnetic field distribution before and after the force bearing.

7 Claims, 2 Drawing Sheets

FORCE HEARING VALUE AND POSITION DETECTION FOR MAGNETIC ELASTIC BODY OF MAGNETIC CONDUCTION

BACKGROUND OF THE INVENTION (a) Field of the Invention

The present invention discloses a bearing force and position detection method for magnetic elastic body, wherein the force bearing status of the magnetic elastic body is detected directly, or the magnetic elastic body is inserted into or combined with the structural body to indirectly detect the force bearing status of the structural body, or the magnetic elastic body under the earth layer is detected to indirectly detect the force bearing status of the earth layer.

(b) Description of the Prior Art

Conventional nondestructive tests for the bearing force status of solids are usually adopted ultrasonic or X ray detections which are limited by their usage environments.

SUMMARY OF THE INVENTION

As it is well known that the magnetic elastic body performing magnetic conduction can be stretched or shrunk by changing the passing magnetic fluxes or by the internal stress or external pushing or pulling force, and the peripheral surrounding of the force bearing point generates corresponding variation of magnetic field properties according to the stretching pull or shrinking push, the present invention imposes a magnetic flux of steady state to the magnetic elastic body thereby its force bearing value or position is calculated by comparing the magnetic field distribution of the magnetic elastic body before and after bearing the force; therefore, said nondestructive detecting method for magnetic elastic body can be extensively applied to an object combined with the magnetic elastic body for measuring or monitoring the object when it is bearing the external force or having internal stress status.

DESCRIPTION OF MAIN COMPONENT SYMBOLS

101: Magnetic elastic body
200: Structural body
300: Earth layer

DETAILED DESCRIPTION OF THE PREFERRED EMBODIMENTS

The present invention discloses a bearing force and position detection method for magnetic elastic body, wherein the force bearing status of the magnetic elastic body is detected directly, or the magnetic elastic body is inserted into or combined with the structural body to indirectly detect the force bearing status of the structural body, or the magnetic elastic body—under the earth layer is detected to indirectly detect the force bearing status of the earth layer.

Conventional nondestructive tests for the bearing force status of solids are usually adopted ultrasonic or X ray detections which are limited by their usage environments.

As it is well known that the magnetic elastic body performing magnetic conduction can be stretched or shrunk by changing the passing magnetic fluxes or by the internal stress or external pushing or pulling force, and the peripheral surrounding of the force bearing point generates corresponding variation of magnetic field properties according to the stretching pull or shrinking push, the present invention imposes a magnetic flux of steady state to the magnetic elastic body thereby its force bearing value or position is calculated by comparing the magnetic field distribution of the magnetic elastic body before and after bearing the force; therefore, said nondestructive detecting method for magnetic elastic body can be extensively applied to an object combined with the magnetic elastic body for measuring or monitoring the object when it is bearing the external force or having internal stress status.

To detect the force bearing value and position of the magnetic elastic body in magnetic conducting status, the magnetic elastic body is placed in a magnetic field to appear magnetic conducting status and disposed in the external force bearing or internal stress status, wherein the magnetic field strength and distribution passed by the magnetic elastic body are relatively changed, and the position and degree of magnetic field changes are detected in order to calculate the force bearing value and position of the magnetic elastic body.

Figure 1:
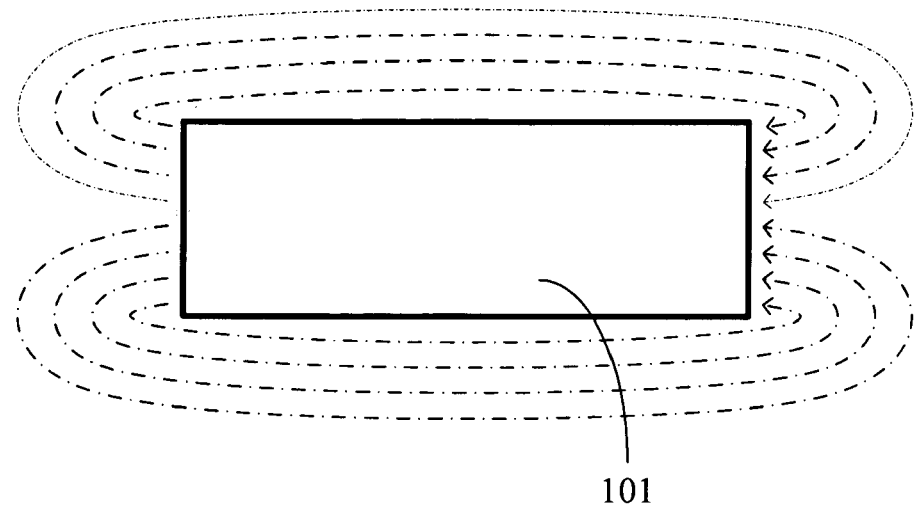
FIG. 1 is a schematic view of the detected magnetic elastic body of the invention in a stable magnetic conducting status.

The force bearing value and position detection for the magnetic elastic body has wide applications including that the magnetic elastic body can be combined or buried in mechanical devices, land/marine/air carriers, structural bodies such as steel structures, buildings, or bridges, or the magnetic elastic body can be buried under earth layer by natural or artificial methods for applications such as observing earth layer under compression status, etc. wherein its applications are summarized in the following:

FIG. 1 is a schematic view of the detected magnetic elastic body of the invention in a stable magnetic conducting status.

Figure 2:
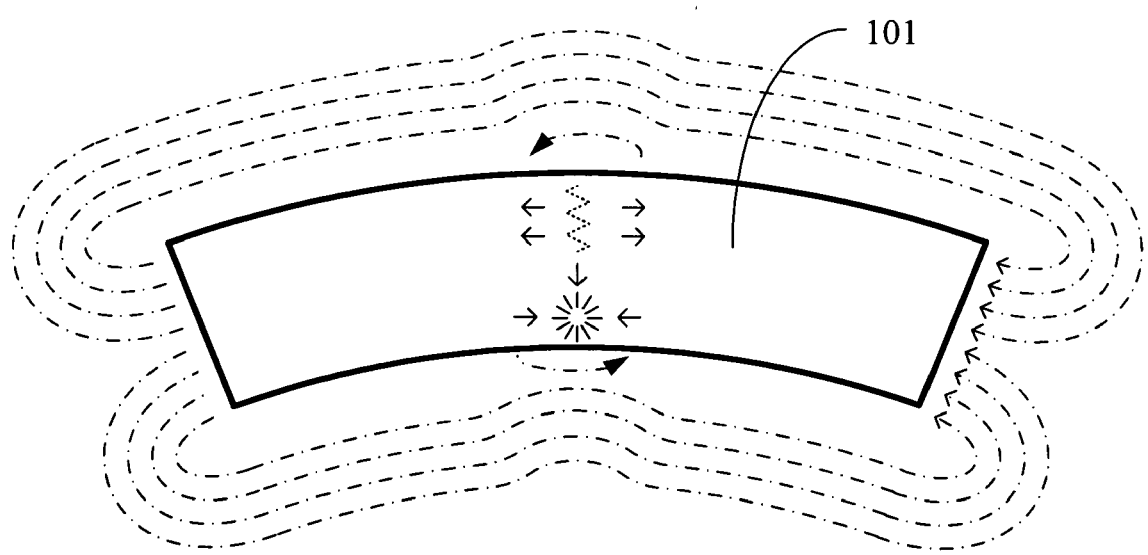
FIG. 2 is a schematic view showing a speculated magnetic field changing status of the detected magnetic elastic body of the invention in force bearing.

FIG. 2 is a schematic view showing a speculated magnetic field changing status of the detected magnetic elastic body of the invention in bearing force.

Figure 3:
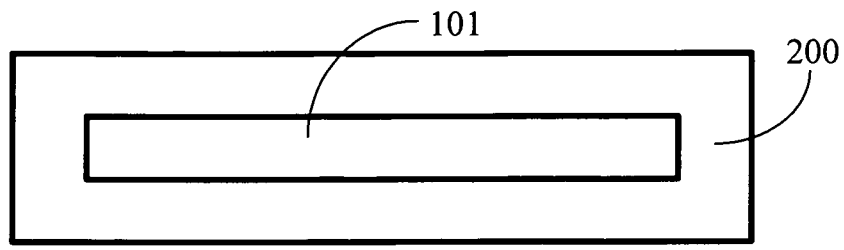
FIG. 3 is a schematic view showing an embodiment of the detected magnetic elastic body of the invention being enclosed by an external structural body.

FIG. 3 is a schematic view showing an embodiment of the detected magnetic elastic body of the invention being enclosed by an external structural body.

Figure 4:
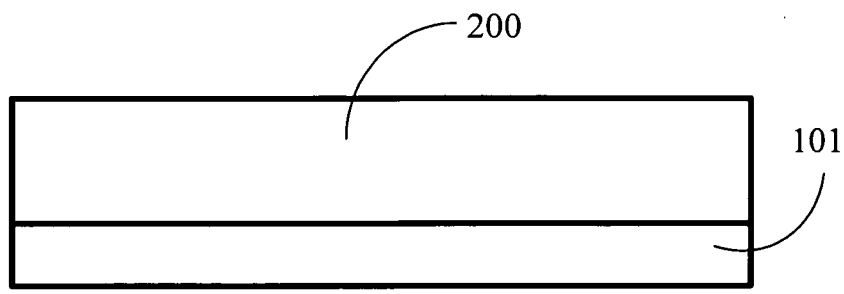
FIG. 4 is a schematic view showing an embodiment of the detected magnetic elastic body being combined with a structural body.

FIG. 4 is a schematic view showing an embodiment of the detected magnetic elastic body being combined with a structural body.

Figure 5:
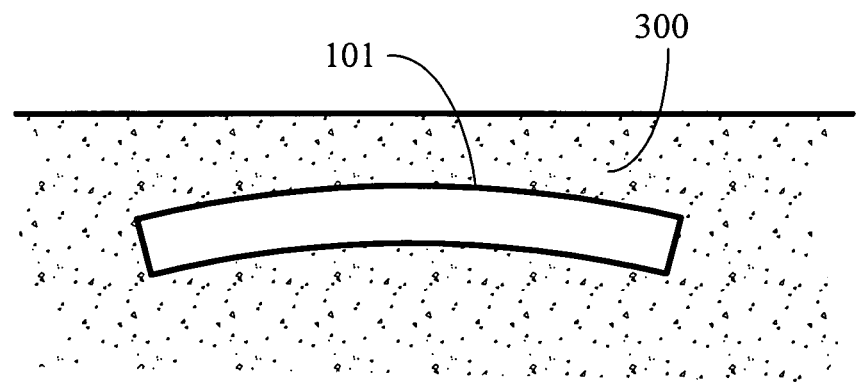
FIG. 5 is a schematic view showing the detected magnetic elastic body of the invention being buried under earth layer

FIG. 5 is a schematic view showing the detected magnetic elastic body of the invention being buried under earth layer.

One or more than one detecting methods for detecting changes of the magnetic field distribution of the present force bearing value and position detection for the magnetic elastic body can be adopted to include the following:

(1) The periodic 1D, 2D or 3D scanning measurement by the magnetic field strength measuring device is converted to corresponding magnetic field strength value so as to further calculate the force bearing value or position of the magnetic elastic body (101); or (2) The generation voltage signal produced by high speed moving conductor performing periodic 1D, 2D or 3D scanning to cut through the magnetic field is converted to corresponding magnetic field strength so as to calculate the force bearing value and position of the magnetic elastic body (101); or (3) The magnetic elastic body (101) is put in a closed container with chosen pressure and gas substance in internal or to ionize the gas substance by imposing amplified lights such as ultraviolet rays or X rays or lasers to measure the distribution status of ionosphere by periodic 1D, 2D or 3D scanning so as to further calculate the force bearing value and position of the magnetic elastic body (101).

The application methods by detecting the magnetic field changes on the magnetic elastic body (101) in magnetic conduction to calculate the force bearing value and position of the magnetic elastic body (101) in magnetic conduction include:

The peripheral magnetic field distribution changes surrounding the magnetic elastic body (101) is measured so as to calculate the force bearing status of the application device constituted by the magnetic elastic body (101);

The peripheral magnetic field distribution changes surrounding the magnetic elastic body (101) is measured so as to calculate the force bearing status of the magnetic elastic body (101) being enclosed by the external structural body (200) and to further calculate the force bearing status of the external structural body (200);

The peripheral magnetic field distribution changes surrounding the magnetic elastic body (101) is measured so as to calculate the force bearing status of the magnetic elastic body (101) being externally combined with the structural body (200), and to further calculate the force bearing status of the externally combined structural body (200);

The peripheral magnetic field distribution changes surrounding the magnetic elastic body (101) is measured so as to calculate the force bearing status of the magnetic elastic body (101) being enclosed within earth layer (300) and to further calculate the force bearing status of the earth layer.

As summarized from above descriptions, the force bearing value and position detection for magnetic elastic body is originally disclosed to characterized in that a magnetic field is imposed on the magnetic elastic body, wherein the peripheral magnetic field distribution surrounding the magnetic elastic body in magnetic conducting status is nondestructively measured thereby calculating the force bearing value and position of the magnetic elastic body.

The invention claimed is:

1. A method for detecting a force bearing value and position of a magnetostrictive body, comprising steps of:
placing a magnetostrictive body in a magnetic conducting status within a magnetic field and applying an external force bearing or internal stress status to the magnetostrictive body, wherein the magnetic field strength and distribution passed by the magnetostrictive body are relatively changed as a result of the external force bearing or internal stress status, and
detecting magnetic field changes in order to calculate the force bearing value and position of the external force bearing or internal stress status of the magnetostrictive body;
wherein the detecting step includes a periodic 2D or 3D scanning measurement by a magnetic field strength measuring device being converted to a corresponding magnetic field strength value so as to calculate the force bearing value and position of the force bearing on the magnetostrictive body.

2. The method according to claim 1, wherein the detecting step further includes a generation voltage signal generated by the magnetic field strength measuring device performing periodic 2D or 3D scanning to cut through the magnetic field is converted to corresponding magnetic field strength so as to calculate the force bearing value and position of the magnetostrictive-body.

3. The method according to claim 1, wherein the detecting step further includes that the magnetostrictive body is put in a closed container with chosen pressure and gas substance in internal or to ionize the gas substance by imposing amplified lights such as ultraviolet rays or X rays or lasers to measure the distribution status of ionosphere by periodic 2D or 3D scanning so as to further calculate the force bearing value and position of the magnetostrictive body.

4. The method according to claim 1, wherein the peripheral magnetic field distribution changes surrounding the magnetostrictive body is measured so as to calculate the force bearing value of the application device constituted by the magnetostrictive body.

5. The method according to claim 1, wherein the peripheral magnetic field distribution changes surrounding the magnetostrictive body is measured so as to calculate the force bearing value of the magnetostrictive body being enclosed by the external structural body and to further calculate the force bearing value of the external structural body.

6. The method according to claim 1, wherein the peripheral magnetic field distribution changes surrounding the magnetostrictive body is measured so as to calculate the force bearing value of the magnetostrictive body being externally combined with the structural body, and to further calculate the force bearing value of the externally combined structural body.

7. A method for detecting a force bearing value and position of a magnetostrictive body, comprising steps of:
placing a magnetostrictive body in a magnetic conducting status within a magnetic field and applying an external force bearing or internal stress status to the magnetostrictive body, wherein the magnetic field strength and distribution passed by the magnetostrictive body are relatively changed as a result of the external force bearing or internal stress status, and
detecting magnetic field changes in order to calculate the force bearing value and position of the external force bearing or internal stress status of the magnetostrictive body;
wherein the detecting step includes a periodic 2D or 3D scanning measurement by a magnetic field strength measuring device being converted to a corresponding magnetic field strength value so as to calculate the force bearing value and position of the force bearing on the magnetostrictive body; and
wherein the peripheral magnetic field distribution changes surrounding the magnetostrictive body is measured so as to calculate the force bearing value of the magnetostrictive body being enclosed within earth layer and to further calculate the force bearing value of the earth layer.

* * * * *